(12) United States Patent
Dell'Aera

(10) Patent No.: US 6,970,701 B1
(45) Date of Patent: Nov. 29, 2005

(54) RADIO CALIBRATION BY CORRECTING THE CRYSTAL FREQUENCY

(75) Inventor: Seste Dell'Aera, Aylmer (CA)

(73) Assignee: Skyworks Solutions, Inc., Irvine, CA (US)

( * ) Notice: Subject to any disclaimer, the term of this patent is extended or adjusted under 35 U.S.C. 154(b) by 291 days.

(21) Appl. No.: 09/702,691

(22) Filed: Nov. 1, 2000

(30) Foreign Application Priority Data

Nov. 2, 1999 (CA) ................................ 2288495

(51) Int. Cl.[7] .............................................. H04Q 7/20
(52) U.S. Cl. ........................ 455/423; 455/340; 348/735
(58) Field of Search ................ 455/340, 67.1, 455/255, 182.1, 184.1, 193.3, 316, 69, 423, 455/128.1; 348/735, 732; 331/176, 116 R, 331/177 R, 47, 158, 2, 11, 117 R; 327/105

(56) References Cited

U.S. PATENT DOCUMENTS

| | | | |
|---|---|---|---|
| 4,360,832 A | | 11/1982 | Rzeszewski |
| 5,552,838 A | * | 9/1996 | Suizu ........................... 348/735 |
| 5,604,468 A | * | 2/1997 | Gillig ........................... 331/176 |
| 5,774,800 A | * | 6/1998 | Mori ............................ 455/255 |
| 5,856,766 A | * | 1/1999 | Gillig et al. .................. 331/176 |
| 5,875,388 A | * | 2/1999 | Daughtry, Jr. et al. ...... 455/67.1 |
| 6,304,517 B1 | * | 10/2001 | Ledfelt et al. ................ 368/10 |
| 6,396,889 B1 | * | 5/2002 | Sunter et al. ................ 375/376 |

FOREIGN PATENT DOCUMENTS

EP  0 948 134 A2  10/1999

* cited by examiner

Primary Examiner—Charles Appiah
Assistant Examiner—Nghi H. Ly
(74) Attorney, Agent, or Firm—Gardner Groff, P.C.

(57) ABSTRACT

The present invention provides a simple and inexpensive method of calibrating radios. The present invention automatically corrects for crystal frequency drift by determining the true crystal frequency. Once the true crystal frequency has been measured and calculated, the proper multiplier required to produce a desired frequency can easily be found and implemented. The present invention allows for a constantly changing desired frequency without recalibration and without readjusting the crystal frequency once the true crystal frequency is known. Once the true crystal frequency is found, a proper multiplier can be calculated to produce the desired frequency. Continuously adjusting the multiplier thus allows for a changing desired frequency, thereby facilitating clear communications between radios, regardless of whether they are in motion or not.

19 Claims, 5 Drawing Sheets

RADIO CALIBRATION BY CORRECTING THE CRYSTAL FREQUENCY

FIELD OF THE INVENTION

This invention relates to radios and crystals used in radio. Specifically, the invention relates to methods and devices used to calibrate radio crystals and to correct for errors in the crystal frequency or errors due to Doppler effects.

BACKGROUND TO THE INVENTION

Modern equipment which use radio waves for communications, such as cellular telephones, generally operate at very high frequencies. These devices use frequency synthesizers to produce the high frequencies required. However, crystals are still needed for the high stability frequency they produce. Frequency synthesizers, such as phase locked loop (PLL) frequency synthesizers phase lock with the highly stable signals of crystals to produce stable high frequency signals.

Essentially, frequency synthesizers, especially PLL frequency synthesizers, phase lock with a crystal signal and multiplies the frequency of that crystal signal to produce a utilizable high frequency stable signal. Thus, the high frequency signal used by the radio equipment is a multiple of the crystal frequency. It should be noted that the multipliers used by frequency synthesizers are not limited to integers. Fractional-N frequency synthesizers can use fractional numbers as multipliers. This feature allows highly accurate frequencies to be produced.

During production, radios have to be tuned to perform at expected frequencies. However, tuning radios to the proper frequency can be time consuming and expensive. Frequently, radios have a tunable component which is adjusted to obtain the correct frequency by a technician during production.

One problem with crystals is that, under certain conditions, the frequency of their signals tends to drift away from the expected frequency. The phase of the crystal signal is still stable; however, the frequency may now be different. Temperature, age of the crystal, and other known factors can cause this unfortunate phenomenon. When this occurs, given that the high frequency signal generated by the frequency synthesizer is a multiple of the crystal frequency, the high frequency signal drifts as well. This can lead to poor transmission and/or reception between radios as the frequency being used is no longer the desired frequency. To remedy this problem, periodic calibration of radios is performed. This entails adjusting the crystal frequency to obtain the correct high frequency signal. Clearly, such methods can be expensive, requiring time consuming disassembly of radios and shop time for technicians to perform the calibration.

Another measure currently in use to compensate for frequency drift in crystals is the use of Voltage Controlled Temperature Compensated Crystal Oscillator (VCTCXO). Using a VCTCXO, the new frequency after drift is determined to be higher or lower than the desired frequency. After this determination, a correction voltage is sent to the VCTCXO to compensate for the drift. However, for the most part, radio manufacturers allow their crystals to drift without correction or compensation. To minimize the possibility of such drifts, manufacturers can use more expensive crystals which are either less prone to drift or which do not drift as much.

Another problem with radios concerns the well known and well documented Doppler effect. Given two communicating radios, with at least one radio in motion relative to the other, the transmission frequency perceived by either radio from the other is constantly changing. This frequency varies as the velocity between the two radios changes. Clearly, the changing frequency perceived by either of the two radios makes for problematic transmissions.

What is therefore needed is a method and an apparatus that allows for fast and inexpensive calibrations of radios. Also needed is a method which compensates for Doppler effects.

SUMMARY OF THE INVENTION

The present invention provides a simple and inexpensive method of calibrating radios. By implementing the invention in a lab or production facility, quick, automatic calibrations are possible. Furthermore, the invention allows for automatic calibrations and corrections for crystal drift without extensive shop time or technician time.

The present invention automatically corrects for crystal frequency drift by determining the true crystal frequency. Once the true crystal frequency has been measured and calculated, the proper multiplier required to produce a desired frequency can easily be found and implemented. The present invention allows for a constantly changing desired frequency without recalibration and without readjusting the crystal frequency once the true crystal frequency is known. Once the true crystal frequency is found, a proper multiplier can be calculated to produce the desired frequency, what ever that may be. Continuously adjusting the multiplier thus allows for a changing desired frequency, thereby facilitating clear communications between radios, regardless of whether they are in motion or not.

In one embodiment, the present invention provides a method of calibrating a radio having a frequency source which produces a first signal having a first frequency by multiplying a second signal having an original frequency by a multiplier value, the method comprising determining the original frequency, utilizing the original frequency to determine a corrected multiplier value, and producing an output signal having an output frequency approximately equal to a desired frequency by adjusting the multiplier value to the corrected multiplier value.

In another embodiment, the present invention provides a method of adjusting an output frequency of a signal produced by a frequency source, the said frequency source producing the signal by multiplying an input signal having an original frequency by a multiplier value, the method comprising:

aa) measuring a preliminary frequency of the signal
ab) adjusting the multiplier value based on the original frequency and a measurement of the preliminary frequency to produce a corrected multiplier value
ac) outputting a signal having an intermediate frequency based on the corrected multiplier value
ad) repeating steps aa) to ac) to obtain a final signal with a final frequency such that a difference between the final frequency and the desired frequency is a minimum.

In a third embodiment, the invention provides a device for adjusting an output frequency of a signal produced by a frequency source comprising:

a frequency source which produces the signal by multiplying:
an input signal having an input frequency and a multiplier having a value a controller coupled to the frequency source, said controller controlling the value of the multiplier a frequency measurement device coupled to the frequency source, said frequency measurement device measuring the output frequency of the signal and producing measurement data relating to the output frequency of the signal wherein the controller is coupled to receive the measurement data produced by the frequency measurement device.

BRIEF DESCRIPTION OF THE DRAWINGS

A better understanding of the invention will be obtained by considering the detailed description below, with reference to the following drawings, in which.

DESCRIPTION OF THE PREFERRED EMBODIMENT

Figure 1:
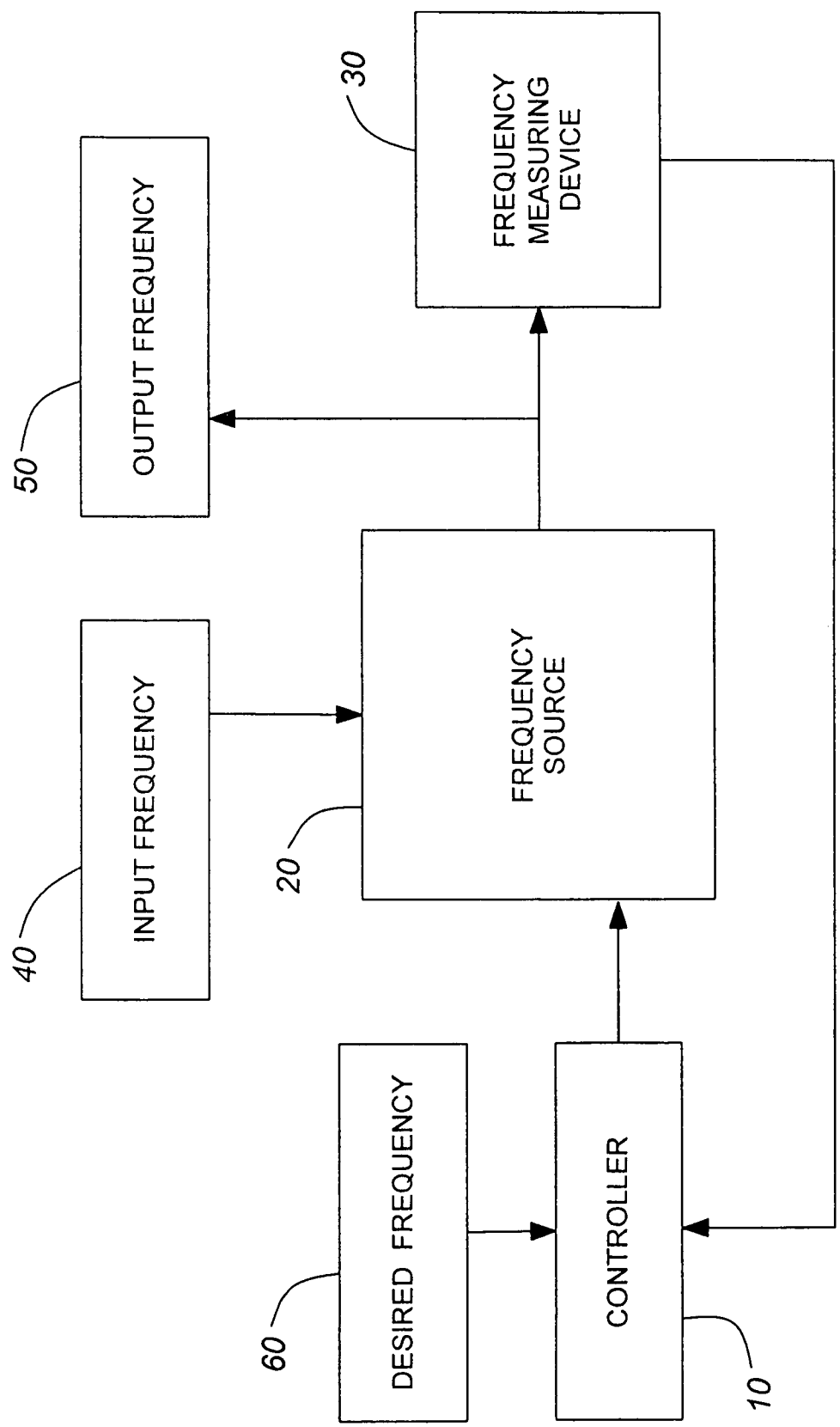
FIG. 1 is a block diagram illustrating the main components of a hardware implementation of the invention.

Referring to FIG. 1, a block diagram of a hardware implementation of the invention is illustrated. A controller 10 is coupled to a frequency source 20 which, in turn, is coupled to a frequency measuring device 30. The frequency source 20 is controlled by the controller 10. The controller 10 controls the multiplier by which the frequency source 20 multiples the input frequency 40 to produce the output frequency 50.

To determine the input frequency 40, one need only know the output frequency 50 and control the multiplier supplied by the controller 10. The controller 10 sets the multiplier to a known value and uses this known multiplier value so that the frequency source 20 produces a signal with an output frequency 50. This signal with the output frequency is accurately measured by the frequency measuring device 30. The measurement data produced by the frequency measuring device 30, which is a measurement of the output frequency 50, is sent to the controller 10. Since the controller 10 knows the multiplier value used by the frequency source 20 to produce the output frequency 50, the controller 10 can easily calculate the value of the input frequency 40. This is done simply by dividing the value of the output frequency 50 by the known multiplier value, yielding the true input frequency.

Once the true input frequency is known, the controller can thereby calculate the multiplier value required by the frequency source 20 to produce a signal with an output frequency 50 approximately equal to a desired frequency 60. Once this corrected multiplier value is found by the controller 10 by dividing the desired frequency to the true input frequency, the corrected multiplier is transmitted to the frequency source 20 so that it can be used to produce the desired frequency.

At this point, the radio device utilizing the invention is calibrated as the controller 10 and the frequency source 20 will continue to use the corrected multiplier value until the input frequency 40 or the desired frequency 60 changes. If desired, the true input frequency can be stored in suitable storage means, such as a read only memory (ROM), for future use.

Figure 2:
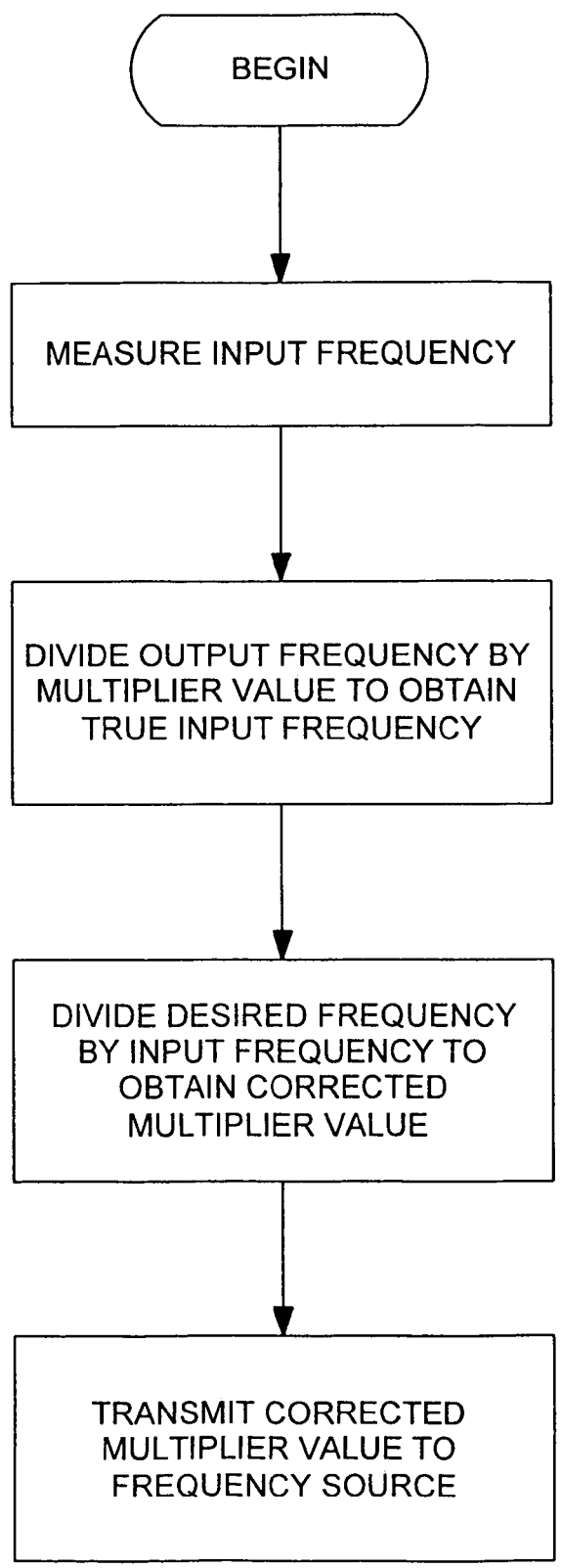
FIG. 2 is a flow chart detailing the different steps of one embodiment of the invention.

FIG. 2 illustrates the logic flow diagram followed by the controller 10 described above.

If the input frequency 40 changes or drifts, perhaps because of the age of a crystal producing the signal with the input frequency 40 or because of temperature effects, the output frequency 50 also changes. This new output frequency 50 is measured by the frequency measuring device 30 and is communicated to the controller 10. The controller 10 then compares the measured new output frequency 50 with the desired frequency 60. If the difference between the desired frequency 60 and the new output frequency 50 is not within preprogrammed tolerances, the controller 10 calculates a new multiplier based on the new output frequency 50. Once this new multiplier value is used by the frequency source 20, the radio device is once again properly calibrated as it produces approximately the desired frequency 60. If the difference between the output frequency 50 and the desired frequency 60 is not within tolerance limits, the calibration starts all over.

Once the difference between the output frequency 50 and the desired frequency 60 is within tolerance limits, the input frequency 40 can now be found. The output frequency 50 is divided by the new multiplier to obtain the input frequency. This input frequency can then be stored in suitable storage means, such as a ROM, for future use.

Figure 3:
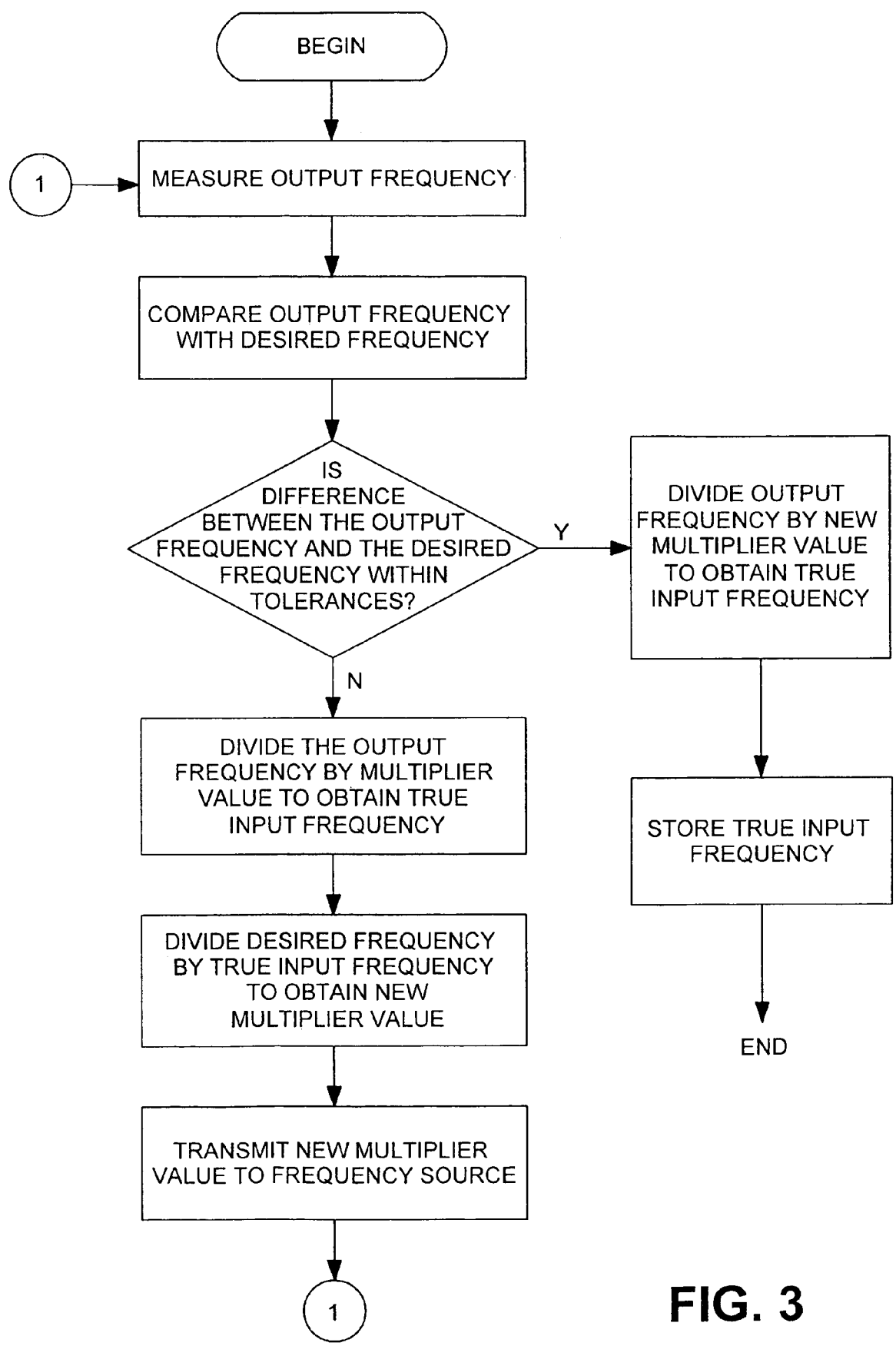
FIG. 3 is a flow chart detailing the different steps of a second embodiment of the invention.

A logic flow diagram followed by the controller as described above 10 is illustrated in FIG. 3.

In another embodiment of the invention, the controller 10 can be used to compensate for a changing desired frequency 60. If, as mentioned above, the radio equipment utilizing the invention is in motion relative to another piece of radio equipment it is communicating with, the output frequency 50 must continually change as the frequency required to communicate with the other piece of radio equipment changes. This means that the desired frequency 60 is constantly changing. When this occurs, the controller 10 must continuously compare the output frequency 50 measured by the frequency measuring device 30 with the changing desired frequency 60. Depending on whether the output frequency 50 is higher or lower than the desired frequency 60, the controller 10 adjusts the multiplier value accordingly. If the output frequency 50 is higher than the desired frequency 60, the multiplier value is lowered from its previous value. Alternatively, if the output frequency 50 is lower than the desired frequency 60, the multiplier value is increased from its previous value.

The amount by which the multiplier value is incremented or decremented can be preprogrammed into the controller. Thus, by having the controller 10 continuously sample, compare, and either increase or decrease the multiplier value, the output frequency 50 approaches the desired frequency 60. This process can terminate once a final output frequency is found. Such a final output frequency is a frequency that, if not exactly equal to the desired frequency, is within tolerance limits to the desired frequency.

The above embodiment can also be used to determine the original or input frequency 40 that was multiplied by a multiplier to synthesize the output frequency 50. Once the final output frequency has been obtained by the above method, the multiplier value used to obtain that final output frequency is noted. The final output frequency is then divided by that multiplier value to determine the original or input frequency 40. This original or input frequency can then be stored in suitable storage means for future use. Once the true original frequency is known, changes in the desired frequency 60 can be accommodated by adjusting the multiplier value.

Figure 4:
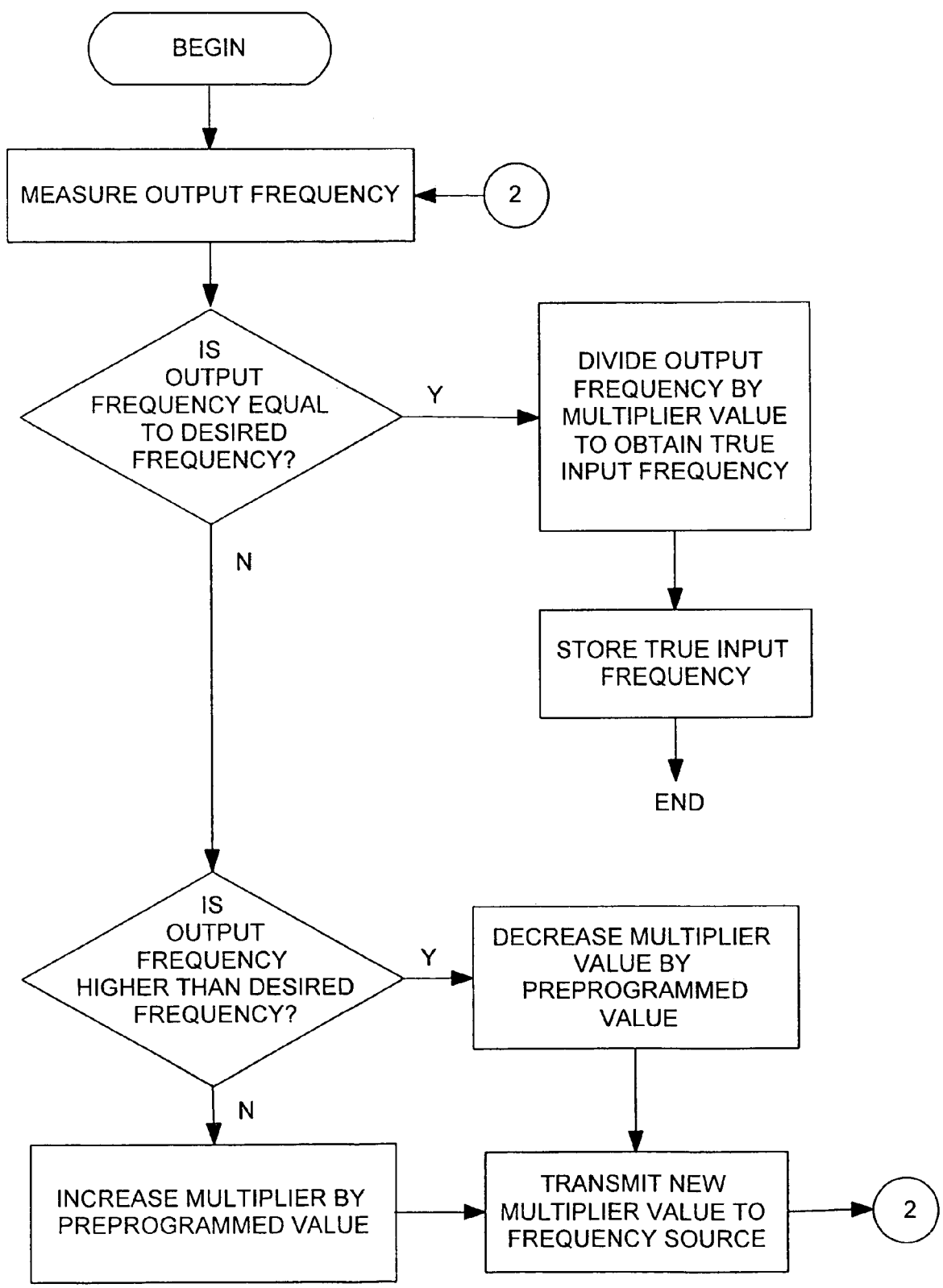
FIG. 4 is a flow chart detailing the different steps of a third embodiment of the invention.

The logical flow diagram followed by the controller 10 in implementing the above is shown in FIG. 4.

Alteratively, the controller 10 can be programmed to find the correct multiplier in one iteration of the method. Given a desired frequency 60 and a true input frequency, the controller 10 can skip numerous iterations by simply, as above, dividing the desired frequency 60 by the input frequency 40 to obtain the appropriate multiplier value. While this method may seem more efficient, if the desired frequency 60 is continuously increasing or continuously decreasing, depending again on the Doppler effect, incrementing or decrementing the multiplier value by a set value may be more computationally efficient.

Figure 5:
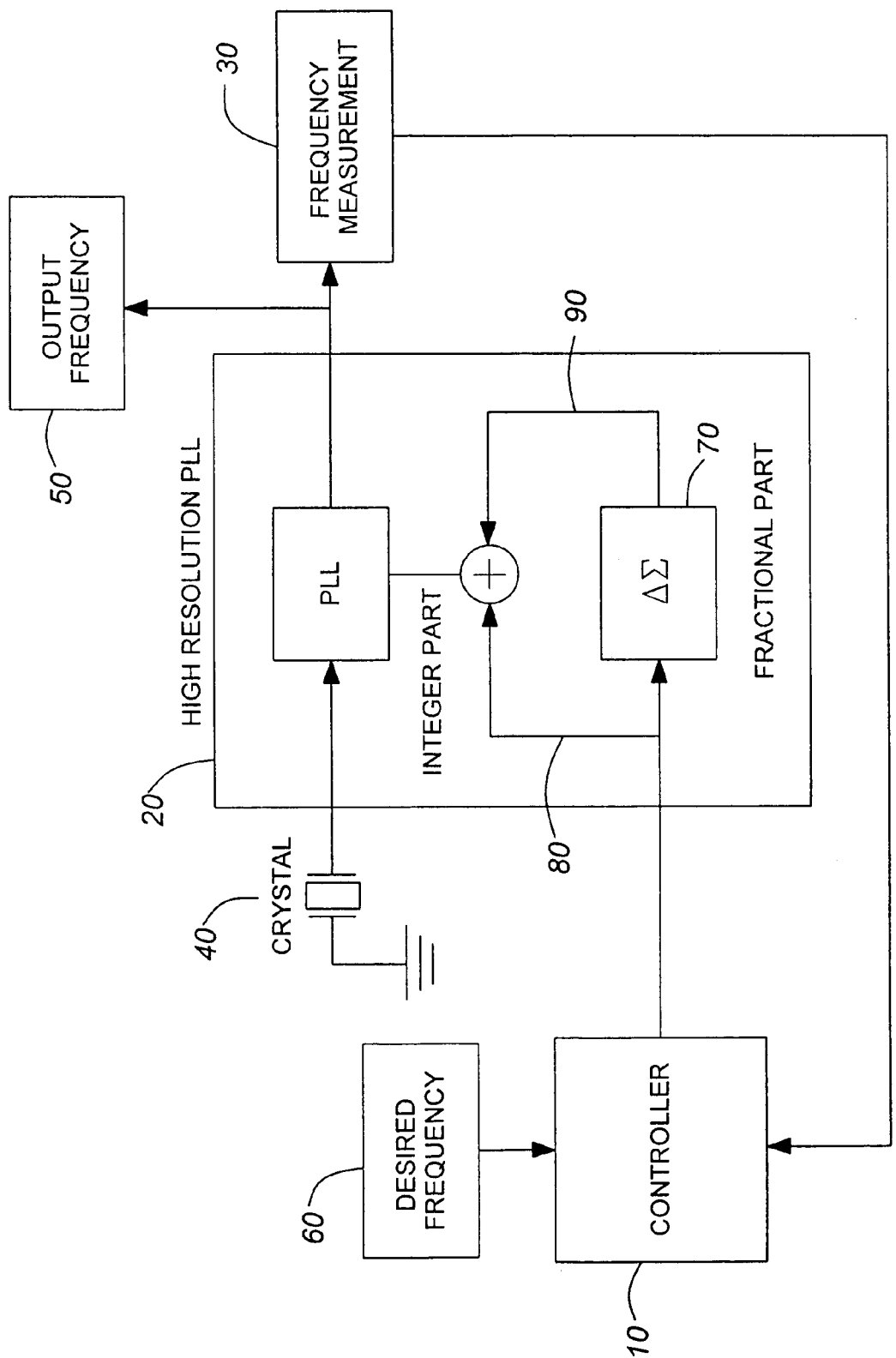
FIG. 5 is a more detailed block diagram of a hardware implementation of the invention.

A more detailed block diagram of a possible embodiment of the invention is pictured in FIG. 5. In this embodiment, the frequency source 20 is a high resolution PLL frequency synthesizer which uses a Delta Sigma modulator 70. The delta sigma modulator 70 allows the use of multiplier values having both an integer part 80 and a fractional part 90. Such a frequency source provides an ideal source for high performance radio equipment and is ideally suited for this invention. A Delta-Sigma PLL frequency synthesizer would be ideally suited for this invention as the Delta-Sigma PLL frequency synthesizer allows for high resolution multipliers, thereby allowing for a correction of small errors in the original frequency. However, it should be noted that any high resolution frequency synthesizer with a controllable multiplier would be suitable for use in this invention.

It should be noted that the controller 10 referred to above can be implemented using well known processors. A dedicated microcontroller or a dedicated general purpose central processing unit can be implemented inside radio equipment to perform the controller functions. In this case, the software required to control the logic of the processor would be resident in a non-volatile memory such as read-only-memory (ROM) with the true input frequency and the multiplier value being stored in either a rewritable non-volatile memory such as an electronically erasable programmable read only memory ($E^2$PROM) or, for a less expensive implementation, in random access memory (RAM). However, for mobile applications, where the invention is resident in a radio, the preferred method of storing the true original frequency is a ROM. In such a case, moving from one wireless network that uses one frequency to another that uses another frequency, would only involve changing the true original frequency by either replacing the ROM.

In a production facility implementation of the invention, to be used to calibrate mass numbers of radios, the controller 10 could be a general purpose computer such as a personal computer. An appropriate interface between the controller 10, which in this implementation would be external to the radio equipment, allows the controller 10 to send multiplier values to the frequency source 20 resident in the radio equipment. Once the calibration has been completed, the controller can either send the true original or input frequency 40 to the radio or the radio can determine the true original or input frequency 40 from the multiplier value. In this implementation, the frequency measurement device 30 would also be external to the radio equipment.

The frequency measurement device 30, in either an internal radio implementation or a production facility implementation, is a suitable high resolution device. In a production facility, suitable frequency counters or spectrum analyzers can serve as frequency measurement devices. In mobile applications, numerous methods or devices can be used. If a radio base station transmits a reference signal, suitable hardware can determine whether the output frequency of the radio is higher or lower than the reference signal. Obviously, the higher the resolution and the better the accuracy of the frequency measuring device, the more accurate and hence the more useful the invention.

The input frequency can be supplied by a crystal which oscillates at a certain frequency. This option is illustrated in FIG. 5.

It should also be noted that the invention can be implemented on a single integrated circuit. All the components listed above, including the code which runs the controller 10, can be stored on a single application specific integrated circuit (ASIC).

A person understanding the above-described invention may now conceive of alternative designs, using the principles described herein. All such designs which fall within the scope of the claims appended hereto are considered to be part of the present invention.

I claim:

1. A method of calibrating a radio having a frequency source which produces a first signal having a first frequency by multiplying an original frequency of a second signal by a multiplier value, the method comprising:
   a) determining the original frequency;
   b) utilizing the original frequency to determine a corrected multiplier value;
   c) adjusting the multiplier value to the corrected multiplier value to produce a desired frequency;
   d) at the frequency source, producing an output signal having an output frequency, which is approximately equal to the desired frequency, by multiplying the original frequency by the corrected multiplier value.

2. A method as claimed in claim 1 wherein step a) further includes the steps of:
   a1) measuring the first frequency
   a2) dividing the first frequency by the multiplier value to obtain the original frequency.

3. A method as claimed in claim 1 wherein step b) includes dividing the desired frequency by the original frequency to obtain the corrected multiplier value.

4. A method as claimed in claim 1 further including the step of storing the original frequency in storage means.

5. A method as in claim 1 wherein the first frequency is generated using a high resolution frequency synthesizer.

6. A method as in claim 5 wherein the second signal is provided by a crystal oscillating at the original frequency.

7. A method of adjusting an output frequency of a signal produced by a frequency source, said frequency source producing the signal by multiplying an original frequency of an input signal by a multiplier value, the method comprising:
   aa) measuring a preliminary frequency of the signal;
   ab) adjusting the multiplier value based on a desired frequency and a measurement of the preliminary frequency to produce a corrected multiplier value;
   ac) at the frequency source, outputting a signal having an intermediate frequency by multiplying the original frequency by the corrected multiplier value; and
   ad) repeating steps aa) to ac) to obtain a final signal with a final frequency such that a difference between the final frequency and the desired frequency is a minimum.

8. A method as claimed in claim 7 wherein step ab) further includes a step chosen from the group comprising:

ab1) incrementing the multiplier value by a preprogrammed value to obtain the corrected multiplier value if the preliminary frequency is lesser than the desired frequency ab2) decrementing the multiplier value by a preprogrammed value to obtain the corrected multiplier value if the preliminary frequency is greater than the desired frequency ab3) utilizing the multiplier value as the corrected multiplier value if the preliminary frequency is approximately equal to the desired frequency.

9. A method as claimed in claim 7 further including the step of obtaining the original frequency by dividing the final frequency by the corrected multiplier value.

10. A method as claimed in claim 9 further including the step of storing the value of the original frequency in a storage means.

11. A device for adjusting an output frequency of a signal produced by a frequency source, the device comprising:
   a frequency source which produces the signal by multiplying:
      an input frequency of an input signal, and
      a multiplier having a value;
   a controller coupled to the frequency source, said controller controlling the value of the multiplier; and
   a frequency measurement device coupled to the frequency source, said frequency measurement device producing measurement data relating to the output frequency of the signal,
   wherein the controller adjusts the value of the multiplier based on the measurement data, and the frequency source produces a signal by multiplying the input frequency and the adjusted multiplier value.

12. A device as claimed in claim 11 wherein the frequency source is chosen from the group comprising:
   a high resolution frequency synthesizer; and
   a radio.

13. A device as claimed in claim 11 wherein the controller is chosen from the group comprising:
   a general purpose microprocessor
   a microcontroller
   a general purpose personal computer.

14. A device as claimed in claim 11 wherein the frequency source, the controller, and the frequency measurement device are implemented on a single application specific integrated circuit.

15. A device as claimed in claim 11 further including storage means for storing the input frequency.

16. A device as claimed in claim 11 wherein the frequency measurement device is connected at the output of the frequency source to measure the output frequency of the signal.

17. A method of calibrating a radio having a frequency source which produces a first signal having a first frequency by multiplying a second signal having an original frequency by a multiplier value, the method comprising:
   a) determining the original frequency;
   b) utilizing the original frequency to determine a corrected multiplier value;
   c) producing an output signal having an output frequency, which is approximately equal to a desired frequency, by adjusting the multiplier value to the corrected multiplier value,
   the determining step a) including:
      i) measuring the first frequency; and
      ii) dividing the first frequency by the multiplier value to obtain the original frequency.

18. A method of adjusting an output frequency of a signal produced by a frequency source, said frequency source producing the signal by multiplying an input signal having an original frequency by a multiplier value, the method comprising:
   a) measuring a preliminary frequency of the signal;
   b) adjusting the multiplier value based on a desired frequency and a measurement of the preliminary frequency to produce a corrected multiplier value;
   c) outputting a signal having an intermediate frequency based on the corrected multiplier value;
   d) repeating steps a) to c) to obtain a final signal with a final frequency such that a difference between the final frequency and the desired frequency is a minimum; and
   f) obtaining the original frequency by dividing the final frequency by the corrected multiplier value.

19. A method as claimed in claim 18 further including the step of storing the value of the original frequency in a storage means.

* * * * *